(12) United States Patent
Eggermont

(10) Patent No.: US 11,677,371 B2
(45) Date of Patent: Jun. 13, 2023

(54) OFFSET COMPENSATION CIRCUITRY FOR AN AMPLIFICATION CIRCUIT

(71) Applicant: SEMICONDUCTOR COMPONENTS INDUSTRIES, LLC, Phoenix, AZ (US)

(72) Inventor: Jean-Paul Anna Joseph Eggermont, Pellaines (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 396 days.

(21) Appl. No.: 17/247,279

(22) Filed: Dec. 7, 2020

(65) Prior Publication Data

US 2022/0045657 A1  Feb. 10, 2022

Related U.S. Application Data

(60) Provisional application No. 63/061,951, filed on Aug. 6, 2020.

(51) Int. Cl.
*H03F 3/45* (2006.01)

(52) U.S. Cl.
CPC ..... *H03F 3/45977* (2013.01); *H03F 3/45475* (2013.01); *H03F 2200/375* (2013.01)

(58) Field of Classification Search
CPC .................................................. H03F 3/45977
See application file for complete search history.

(56) References Cited

U.S. PATENT DOCUMENTS

| | | | | |
|---|---|---|---|---|
| 3,754,215 A | * | 8/1973 | Blomenkamp | H04M 11/002 340/7.49 |
| 3,855,514 A | * | 12/1974 | Zwitter | G05B 19/33 318/605 |
| 4,651,110 A | * | 3/1987 | Lechner | H03F 3/45475 327/307 |
| 6,140,872 A | * | 10/2000 | McEldowney | H03F 3/45977 330/253 |
| 2005/0110550 A1 | | 5/2005 | Shi et al. | |
| 2007/0292139 A1 | * | 12/2007 | Nakamura | H03G 3/3084 398/116 |
| 2009/0128238 A1 | | 5/2009 | Lin et al. | |
| 2009/0212856 A1 | | 8/2009 | Chen et al. | |
| 2014/0176238 A1 | | 6/2014 | Guo et al. | |
| 2018/0131342 A1 | * | 5/2018 | Zamprogno | H03F 3/45973 |
| 2019/0128932 A1 | * | 5/2019 | Fernandez | G01R 19/2506 |

* cited by examiner

*Primary Examiner* — Patricia T Nguyen
(74) *Attorney, Agent, or Firm* — Dickinson Wright PLLC; Mark E. Scott

(57) ABSTRACT

Offset compensation circuitry for an amplification circuit. One example embodiment is a method of compensating a primary operational amplifier including: creating, by way of a companion circuit, a square wave having an amplitude, a period, and a direct current bias (DC bias), the amplitude proportional to an offset of the primary operational amplifier; integrating, by the companion circuit, the amplitude of the square wave for less than the period of the square wave, the integrating creates a compensation signal; and applying the compensation signal to the primary operational amplifier.

20 Claims, 6 Drawing Sheets

OFFSET COMPENSATION CIRCUITRY FOR AN AMPLIFICATION CIRCUIT

CROSS-REFERENCE TO RELATED APPLICATIONS

This application claims the benefit of U.S. Provisional Application No. 63/061,951 filed Aug. 6, 2020 and titled "Method and Apparatus for Offset Compensation of an Amplifier." The provisional application is incorporated herein by reference as if reproduced in full below.

BACKGROUND

Operational amplifiers find use in many electronic circuits. While an ideal operational amplifier has very high gain and no direct current (DC) offset, in practice operational amplifiers have a parasitic DC offset. Compensating for the DC offset may lower the gain to unacceptable levels. Any system or technique that better addresses correcting or compensating for DC offset may provide a competitive advantage in the market place.

SUMMARY

To be finalized after claims are finalized.

BRIEF DESCRIPTION OF THE DRAWINGS

For a detailed description of example embodiments, reference will now be made to the accompanying drawings in which.

DEFINITIONS

Figure 1:
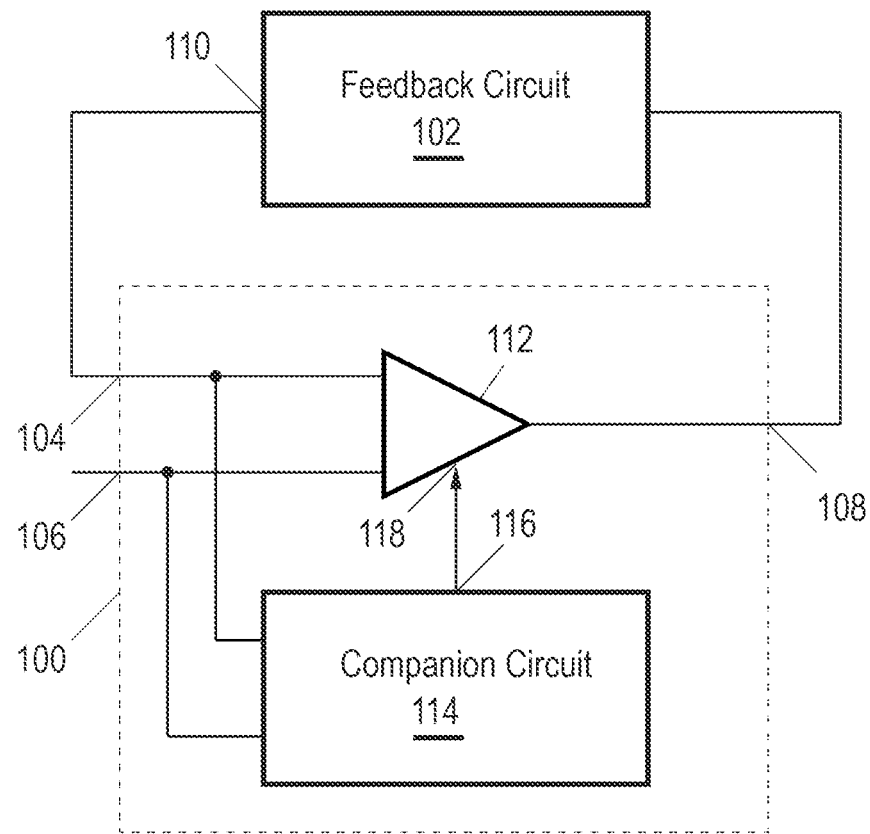
FIG. 1 shows an electronic circuit in accordance with at least some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

In relation to electrical devices (whether stand alone or as part of an integrated circuit), the terms "input" and "output" refer to electrical connections to the electrical devices, and shall not be read as verbs requiring action. For example, a differential amplifier (such as an operational amplifier) may have a first differential input and a second differential input. These "inputs" define electrical connections to the operational amplifier, and shall not be read to require inputting signals to the operational amplifier.

"Assert" shall mean changing the state of a Boolean signal. Boolean signals may be asserted high or with a higher voltage, and Boolean signals may be asserted low or with a lower voltage, at the discretion of the circuit designer. Similarly, "de-assert" shall mean changing the state of the Boolean signal to a voltage level opposite the asserted state.

"Controller" shall mean, alone or in combination, individual circuit components, an application specific integrated circuit (ASIC), a microcontroller with controlling software, a digital signal processor (DSP), a processor with controlling software, a programmable logic device (PLD), or a field programmable gate array (FPGA), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various example embodiments are directed to offset compensation circuitry for an amplification circuit. More particularly, at least some example embodiments are directed to compensating a primary operational amplifier by creating a square wave signal whose amplitude is proportional to the DC offset of the primary operational amplifier, integrating the square wave signal for less than the period of the square wave signal to create a compensation signal, and then applying the compensation signal to the primary operational amplifier. The specification first turns to shortcomings of existing compensation techniques.

Existing compensation techniques have several shortcomings. For example, "chopping" is a technique where the polarity of the output of an operational amplifier is periodically swapped simultaneously with swapping the polarity of the inputs. In the chopping technique, the DC offset of the operational amplifier is averaged out over time by the chopping. However, chopping is not an acceptable technique in situations where the output signal is low, as the chopping may result in undesirable negative output signals. Moreover, at any given instant in time, the magnitude of the DC offset (e.g., either positive of negative) is still present at the output of the operational amplifier.

Another technique is to periodically disconnect the operational amplifier from the circuit, measure the DC offset, and then apply a compensation signal to the operational amplifier. Such techniques are not feasible when the operational amplifier needs to be in continuous operation. Moreover, a capacitor that holds the compensation signal may be subject to voltage drift.

Yet still other techniques use a matched set of operational amplifiers, one operational amplifier being primary and the other operational amplifier being secondary. That is, two operational amplifiers are manufactured on the same substrate. The matched operational amplifiers have the same transistor types, same emitter sizes, and the same doping. A signal created by the secondary operational amplifier may be used to compensate the DC offset of the primary operational amplifier. However, such techniques effectively double the silicon area for the overall circuit, and the presence of the secondary operational amplifier may cause stability issues in the loop gain characteristics. The specification now turns to a system in accordance with example embodiments.

FIG. 1 shows a block diagram of an example electronic circuit. In particular, FIG. 1 shows an operational amplifier system 100 (within the dashed box) and a feedback circuit 102. The operational amplifier system 100 defines a first primary input 104, a second primary input 106, and a primary output 108. The primary output 108 is coupled to the feedback circuit 102. The feedback circuit 102 may be the controlled circuit, a controlled system of a feedback control network, or a closed-loop control system. The feedback circuit 102 produces a feedback output 110 upon which a feedback signal is provided. The feedback output 110 is coupled to the first primary input 104, and a reference signal (e.g., set point signal) may be applied to the second primary input 106. In steady state operation, the operational amplifier system 100 produces an output signal on the primary output 108 in an attempt to drive the feedback signal applied to the first primary input 104 to be as close as possible to the reference signal applied to the second primary input 106.

The example operational amplifier system 100 comprises a primary operational amplifier 112. The primary operational amplifier 112 directly defines the first primary input 104, the second primary input 106, and the primary output 108. The operational amplifier system 100 further defines a companion circuit 114. The companion circuit 114 is coupled to the first primary input 104 and the second primary input 106. The companion circuit 114 defines a compensation output 116 that couples to a compensation input 118 of the primary operational amplifier 112. The primary operational amplifier 112 is designed and constructed to adjust or compensate an output signal driven on the primary output 108 based on a compensation signal received on the compensation input 118.

Consider, as an example, that the electronic circuit of FIG. 1 is in operation and has reached a steady-state condition. Further, consider that the primary operational amplifier 112 has an uncorrected DC offset. In steady state operation, the uncorrected DC offset of the primary operational amplifier 112 manifests itself as a differential voltage across the first primary input 104 and the second primary input 106. The magnitude of the differential voltage is proportional to the DC offset, and in some cases the differential voltage may directly be DC offset depending on the nature of the overall circuit. Hereafter, the differential voltage will be referred to as the DC offset. In accordance with example embodiments, the companion circuit 114 is designed and constructed to create a square wave signal (hereafter just square wave) having an amplitude, a period, and a direct current bias (DC bias). The amplitude of the square wave (e.g., peak-to-trough voltage) is proportional to the DC offset across the first primary input 104 and second primary input 106. In other words, the amplitude of the square wave is proportional to the DC offset of the primary operational amplifier 112. The companion circuit 114 is designed and constructed to integrate the square wave for less than a period of the square wave. In some cases, the companion circuit 114 integrates for half the period or less, and in a particular case the companion circuit 114 integrates only one transition of the square wave (e.g., peak-to-trough, or trough-to-peak).

Regardless of the length and alignment of the integration, the integration creates a compensation signal that is applied to the compensation output 116 and thus the compensation input 118. The primary operational amplifier 112, in turn, adjusts its output signal based on the compensation signal. The specification now turns to an example operational amplifier system.

Figure 2:
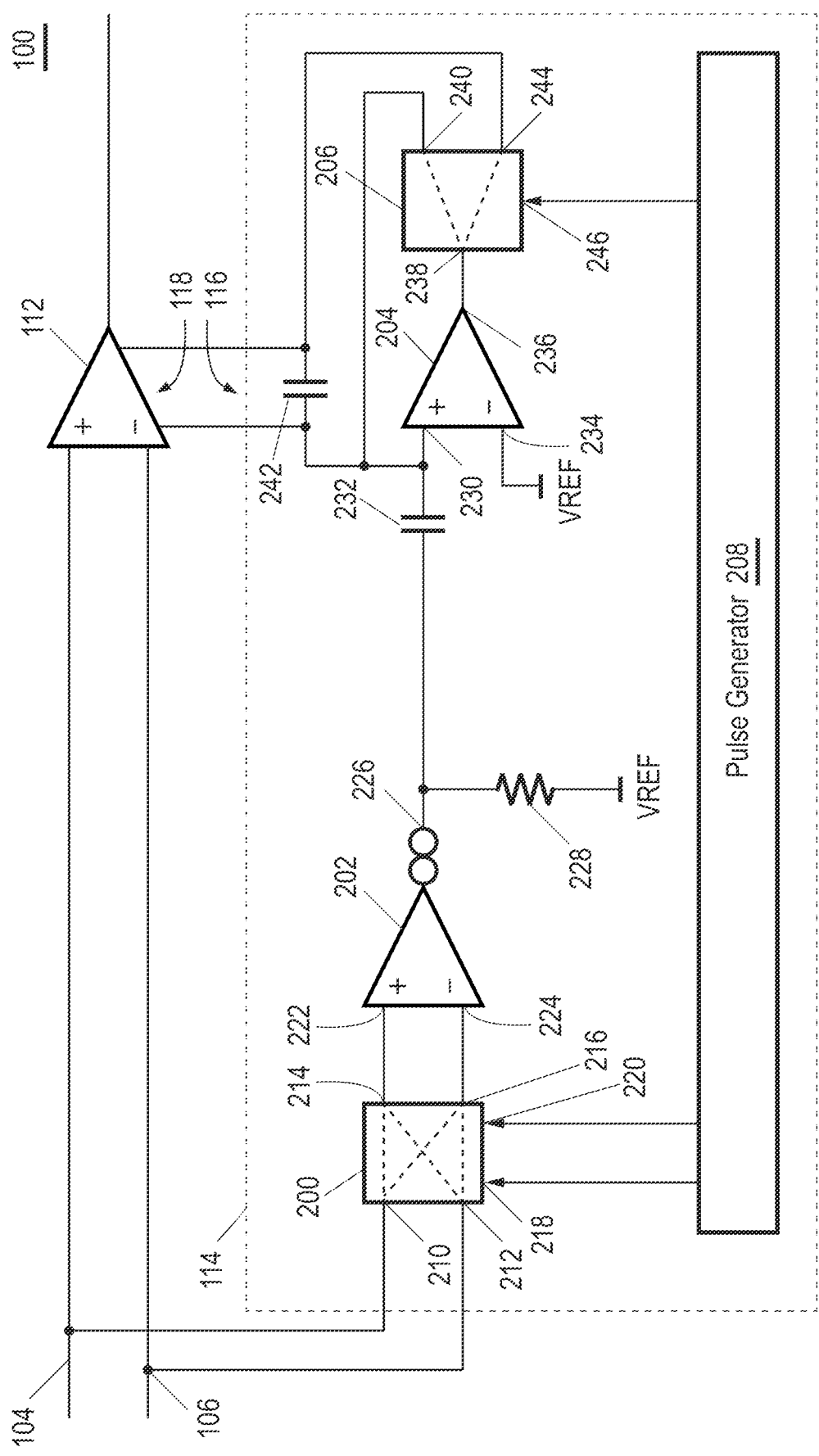
FIG. 2 shows a circuit diagram of an operational amplifier system in accordance with at least some embodiments.

FIG. 2 shows a circuit diagram of an operational amplifier system 100 in accordance with at least some embodiments. In particular, FIG. 2 shows the primary operational amplifier 112 and the companion circuit 114. The example companion circuit 114 comprises an input switch network 200, a sense amplifier 202, an integrating amplifier 204, a feedback switch network 206, and a pulse generator 208. The input switch network 200 defines a first input 210 coupled to the first primary input 104, a second input 212 coupled to the second primary input 106, a first output 214, and a second output 216. The example input switch network further defines a control input 218 and a control input 220.

The sense amplifier 202 may be, in some embodiments, an operational transconductance amplifier (OTA), and is hereafter referred to as OTA 202. The OTA 202 defines a non-inverting input 222 coupled to the first output 214, an inverting input 224 coupled to the second output 216, and a sense output 226. The sense output 226 is coupled to a reference voltage VREF by way of a resistor 228. The OTA 202 and the resistors 228 create a fixed gain between the differential input voltage of the OTA 202 and the output voltage with respect to VREF. Consistent with operation of an OTA, the OTA 202 produces a current whose magnitude is proportional to the difference in voltage across the non-inverting input 222 and the inverting input 224. Given the presence of the resistor 228 and reference voltage VREF, the current produced by the OTA 202 creates a voltage that "rides" on top of the reference voltage VREF. In other cases, the OTA 202 may be replaced by an operational amplifier with an appropriate gain.

The integrating amplifier 204, in the example form of an operational amplifier, defines a non-inverting input 230 coupled to the sense output 226 by way of a blocking capacitor 232, an inverting input 234 coupled to the reference voltage VREF, and an integration output 236 coupled to a shared input 238 of the feedback switch network 206. The feedback switch network 206 defines an integrate output 244 coupled the non-inverting input 230 by way of a feedback capacitor 242, and a follower output 240 coupled directly to the non-inverting input 230. The feedback switch network 206 further defines control input 246 coupled to the pulse generator 208. In example systems, a voltage held on the feedback capacitor 242 defines a compensation signal supplied to the primary operational amplifier 112. Thus, the compensation signal is created on the leads of the feedback capacitor 242, and the leads of the feedback capacitor 242 are coupled to the primary operational amplifier 112 at the compensation input 118.

The input switch network 200 may comprise one or more electrically-controlled switches that enable selective coupling of the first primary input 104 and/or the second primary input 106 to the non-inverting input 222 and/or inverting input 224. For example, in one configuration of the input switch network 200 (e.g., when the control input 218 is asserted and the control input 220 is de-asserted), the input switch network 200 may directly couple the first primary input 104 to the non-inverting input 222 and directly couple the second primary input 106 to the inverting input 224. In another configuration (e.g., when the control input 218 is de-asserted and the control input 220 is asserted), the input switch network 200 may directly couple the first primary input 104 to the inverting input 224 and directly couple the second primary input 106 to the non-inverting input 222.

Figure 3:
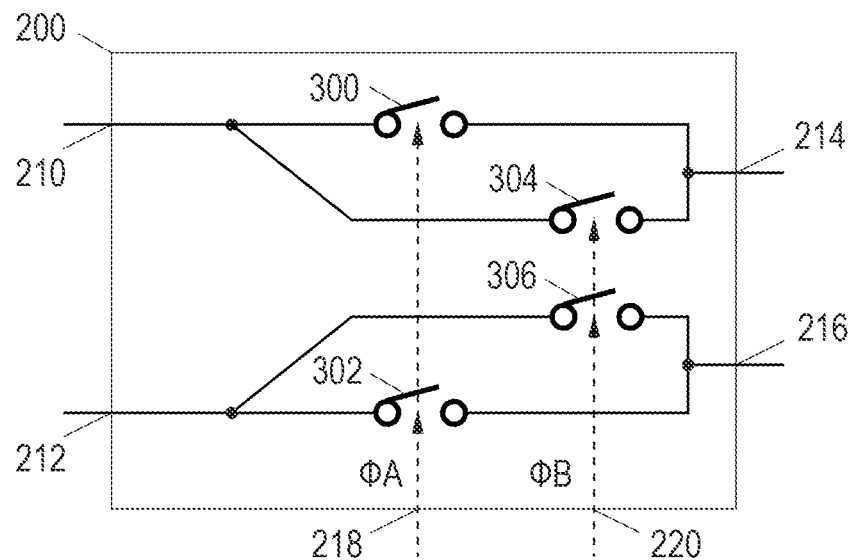
FIG. 3 shows an electrical schematic of an input switch network in accordance with at least some embodiments.

FIG. 3 shows an electrical schematic of an example input switch network 200. In particular, FIG. 3 shows that the example input switch network 200 defines the first input 210, the second input 212, the first output 214, the second output 216, the control input 218, and the control input 220. The example input switch network 200 of FIG. 3 includes four electrically-controlled switches. Each electrically-controlled switch is shown as single-pole single-throw switch to simplify the discussion, but in practice each electrically-controlled switch may be a transistor (e.g., a field effect transistor (FET)) operated as a switch. In particular, the input switch network 200 defines switch 300 with a first lead coupled to the first input 210, a second lead coupled to the first output 214, and a control input coupled to the control input 218. Switch 302 defines a first lead coupled to the second input 212, a second lead coupled to the second output 216, and a control input coupled to the control input 218. In operation, when the control input 218 is asserted (e.g., when ϕA is asserted), switches 300 and 302 are conductive, and thus the first input 210 (e.g., coupled to the first primary input 104) and the second input 212 (e.g., coupled to the second primary input 106) apply the DC offset from the primary operational amplifier 112 (FIG. 1) to the first output 214 and the second output 216 with a first polarity. Stated otherwise, when the control input 218 is asserted, the input switch network 200 couples inputs and outputs straight through the input switch network.

The input switch network 200 further defines switch 304 with a first lead coupled to the second input 212, a second lead coupled to the first output 214, and a control input coupled to the control input 220. Switch 306 defines a first lead coupled to the first input 210, a second lead coupled to the second output 216, and a control input coupled to the control input 220. In operation, when the control input 220 is asserted (e.g., when ϕB is asserted), switches 304 and 306 are conductive, and thus the first input 210 and the second input 212 apply the DC offset across the primary operational amplifier 112 (FIG. 1) to the first output 214 and the second output 216 with a second polarity, opposite the first polarity. Stated otherwise, when the control input 220 is asserted, the input switch network 200 cross-couples inputs and outputs through the input switch network.

Figure 4:
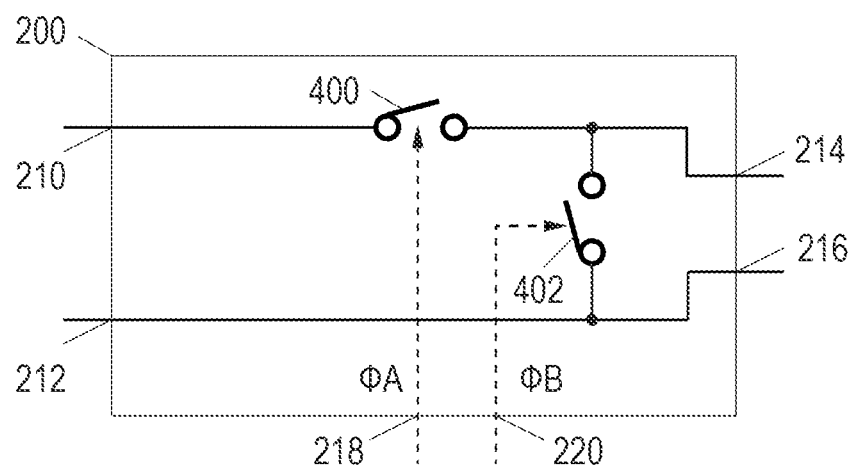
FIG. 4 shows an electrical schematic of an input switch network in accordance with at least some embodiments.

FIG. 4 shows an electrical schematic of another example input switch network 200. In particular, FIG. 4 again shows that the input switch network 200 defines the first input 210, the second input 212, the first output 214, the second output 216, the control input 218, and the control input 220. In the example FIG. 4, the input switch network 200 includes two electrically-controlled switches with each switch shown as a single-pole single-throw switch. Again, however, in practice each electrically-controlled switch may be a transistor (e.g., FET) operated as a switch. In particular, the input switch network 200 of FIG. 4 defines a switch 400 with a first lead coupled to the first input 210, a second lead coupled to the first output 214, and a control input coupled to the control input 218. Switch 402 defines a first lead coupled to the first output 214, a second lead coupled to the second output 216, and a control input coupled to the control input 220. Moreover, in the example input switch network 200 of FIG. 4 the second input 212 is coupled directly to the second output 216.

In operation, when the control input 218 is asserted (e.g., when ϕA is asserted), switch 400 is conductive and thus the first input 210 and the second input 212 apply the DC offset from the primary operational amplifier 112 (FIG. 1) to the first output 214 and the second output 216. Stated otherwise, when the control input 218 is asserted, the input switch network 200 couples the inputs straight through to the outputs of the input switch network 200. Oppositely, when the control input 220 is asserted (e.g., when ϕB is asserted), switch 402 is conductive, and thus the first output 214 and the second output 216 are shorted through the switch 402.

Figure 5:
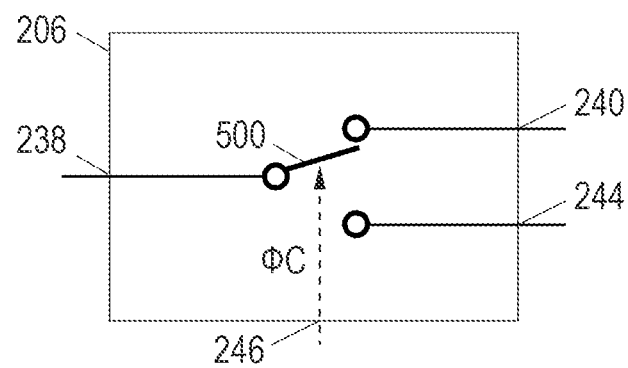
FIG. 5 shows an electrical schematic of a feedback switch network in accordance with at least some embodiments.

FIG. 5 shows an electrical schematic of a feedback switch network 206 in accordance with at least some embodiments. In particular, FIG. 5 shows that the feedback switch network 206 defines the shared input 238, the follower output 240, and the integrate output 244. In the example of FIG. 5, the feedback switch network 206 includes an electrically-controlled switch shown as single-pole double-throw switch. However, in practice the single-pole double-throw switch may be a set of oppositely acting transistor (e.g., P-channel FET and an N-channel FET) implemented as switches, or any other suitable arrangement. In particular, the feedback switch network 206 defines switch 500 with a first lead coupled to the shared input 238, a first pole coupled to the shared output 240, a second pole coupled to the integrate output 244, and a control input coupled to the control input 246.

In operation, when the control input 246 is asserted (e.g., when ϕC is asserted), switch 500 couples the shared input 238 to the first pole and thus follower output 240 as shown FIG. 5. When the shared input 238 is coupled to the follower output 240, the integrating amplifier 204 (FIG. 2) is set up as a unity gain amplifier and/or voltage follower. Oppositely, when the control input control input 256 is de-asserted, switch 500 couples the shared input 238 to the integrate output 244. When the shared input 238 is coupled to the integrate output 244, the integrating amplifier 204 is set to up to integrate with the resultant held by the feedback capacitor 242 (FIG. 2). In order to explain operation of the operational amplifier system 100, the specification now turns to an example set of waveforms.

Figure 6:
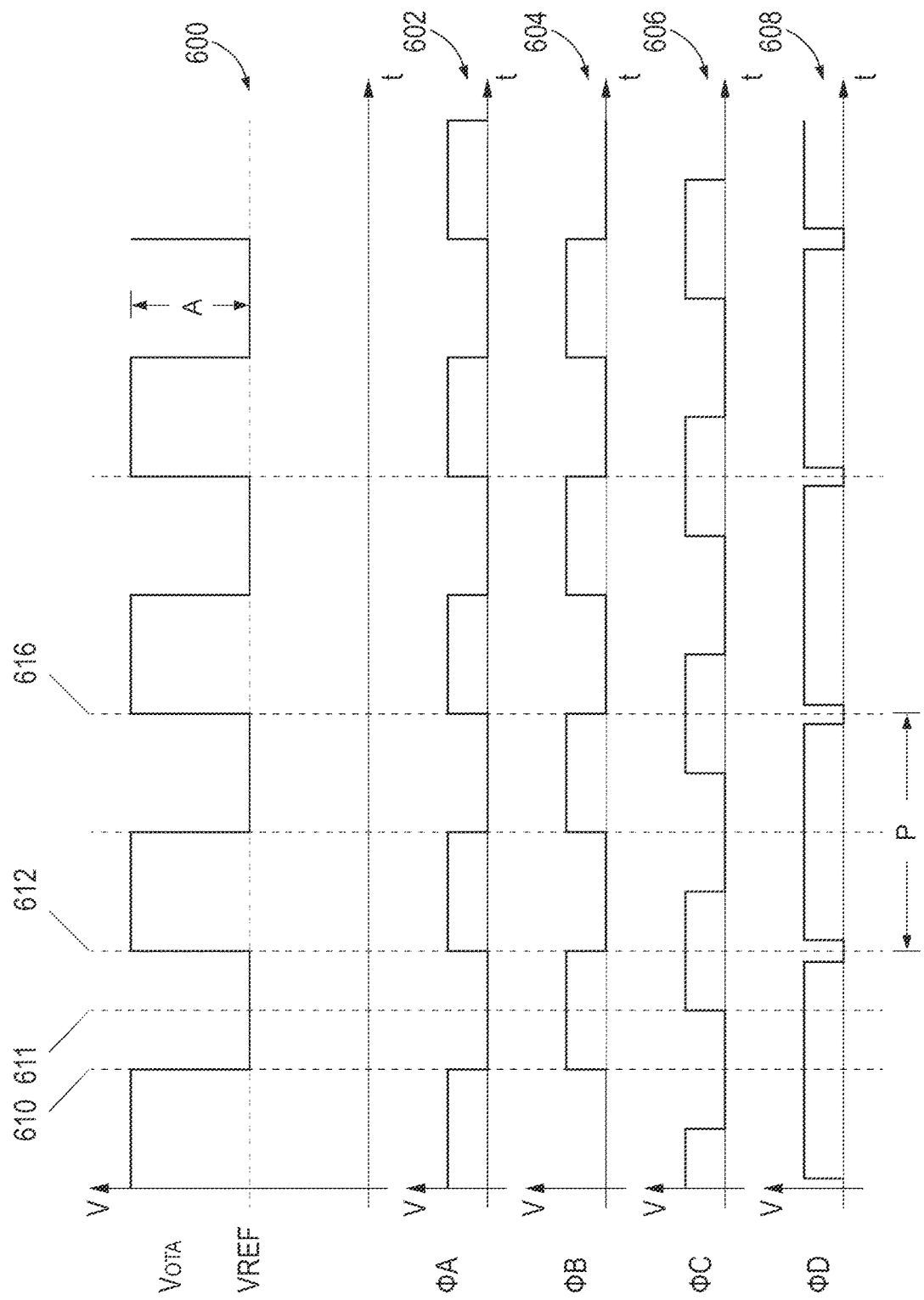
FIG. 6 shows a timing diagram in accordance with at least some embodiments.

FIG. 6 shows a timing diagram in accordance with at least some embodiments. In particular, FIG. 6 shows a plurality of plots of various signals all with corresponding time, though the various plots are not necessarily to scale. In particular, the following plots are shown: plot 600 shows voltage at the output of the OTA 202 (e.g., produced at the top of resistor 228); plot 502 shows a clock or timing signal ϕA produced by the pulse generator 208 and provided to control input 218; plot 504 shows a clock or timing signal ϕB produced by the pulse generator 208 and provided to control input 220; plot 506 shows a clock or timing signal ϕC produced by the pulse generator 208 and provided to control input 246; and plot 508 shows a clock or timing signal ϕD discussed more below. The various Boolean signals are shown asserted high; however, the system may be equivalently implemented with some or all the Boolean signals asserted low.

Referring simultaneously to FIGS. 2 and 6. In operation, the input switch network 200 alternates between its two modes or two switch configurations based on the asserted states of the control inputs 218 (e.g., ϕA) and 220 (e.g., ϕB). Alternating between the two switch configurations creates a square wave having an amplitude, a period, and DC bias. In plot 600, the amplitude (e.g., peak-to-trough) is shown by amplitude A, and the amplitude is proportional to the DC offset of the primary operational amplifier 112. In cases where the input switch network 200 is implemented as shown in FIG. 3 (e.g., the DC offset is coupled in both a first and second polarity), the amplitude A is proportional to twice the DC offset multiplied by the gain of the OTA 202. In cases where the input switch network 200 is implemented as shown in FIG. 4 (e.g., the DC offset is coupled, and then inputs to the OTA 202 are shorted), the amplitude A is proportion to the DC offset multiplied by the gain of the OTA 202. Regardless of which input switch network is implemented, the result is the square wave of plot 600 "riding" on top of the reference voltage VREF as shown, and thus the VREF voltage largely defines the DC bias. The square wave further defines a period between any two consistent features, such as rising edges (e.g., period P defined by the time duration between vertical lines 612 and 616).

Thus, in the example system, when control input 218 (e.g., ϕA) is asserted and the control input 220 (e.g., ϕB) is de-asserted, the DC offset is applied to the OTA 202 in a first polarity producing the higher level voltage of the square wave of plot 600. When control input 218 (e.g., ϕA) is de-asserted and the control input 220 (e.g., ϕB) is asserted, the OTA 202 produces the lower level or trough voltage of the square wave of plot 600. The lower level or trough voltage can be caused by applying the DC offset with a reversed polarity (e.g., using the input switch network of FIG. 3), or the trough voltage can be caused by shorting the inputs of the OTA 202 (e.g., using the input switch network of FIG. 4).

In accordance with example embodiments, the companion circuit 114 creates a compensation signal by integrating the square wave of plot 600 for less than the period P of the square wave. In some cases, the integration of the square wave is for half the period P or less. In the example system, the asserted state of the control input 246 (e.g., ϕC) controls the time of integration during each period of the square wave. In particular, the control input 246 (e.g., ϕC) is asserted for a time duration spanning a transition of the square wave (e.g., peak-to-trough, or tough-to-peak) of the square wave. In the example of FIG. 6, the control input 246 (e.g., ϕC) is asserted during each low-to-high transition of the square wave. Equivalently stated, the example control input 246 is asserted for a clock transition, such as a falling edge of the ϕA signal or a rising edge of the example ϕB signal. When the control input 246 (e.g., ϕC) is asserted, the integrating amplifier 204 is arranged for integration, with the resultant stored on the feedback capacitor. During periods of time when control input 246 (e.g., ϕC) is de-asserted, the integrating amplifier 204 is arranged for unity gain or voltage following. In the unity gain arrangement, the integration amplifier drives its integration output to match the reference voltage VREF. That is, in the unity gain arrangement the reference voltage is driven to the non-inverting input 230 of the integration amplifier.

Now understanding all the possible states of the various switch networks, consider the time period beginning at the time represented by the vertical line 610. At the moment in time represented by vertical line 610, the control input 246 (e.g., ϕC) is de-asserted, and thus the integrating amplifier 204 is arranged for unity gain. The feedback capacitor 242 is disconnected, but holds a voltage that is the resultant of the integration in a previous period. The reference voltage VREF is driven to the non-inverting input 230, and the system is pre-charged or primed for the next integration phase. The lower level or trough voltage of the square wave of plot 600 resides at or near voltage reference VREF.

At the moment in time represented by the vertical line 611, the control input 246 (e.g., ϕC) transitions to an asserted state. The feedback switch network 206 thus arranges the integrating amplifier 204 for integration mode. In the example method shown, the control input 246 (e.g., ϕC) remains asserted for a time duration that includes a transition of the square wave from the lower level or trough voltage to the higher level (e.g., integration occurs across the clock transition of ϕA or ϕB). Because the blocking capacitor 232, the integrating amplifier 204 sees only the alternating current (AC) component of the transition of the square wave, and integrates that transition. The integration modifies the previous voltage stored on the feedback capacitor 242, and the voltage stored on the feedback capacitor 242 (e.g., the compensation signal) is applied to the compensation input 118 (FIG. 1) of the primary operational amplifier 112.

If the square wave of the plot 600 is considered as a Fourier series combination of a plurality of sinusoids, it can be considered that at least the fundamental frequency will pass the blocking capacitor 232 and thus be integrated for the integration duration. Considered this way, the integrating amplifier 204 integrates the value of the fundamental sinusoid as it transitions from lower inflection voltage to the higher inflection voltage. In some cases the asserted duration of the control input 246 (e.g., ϕC) may enable the integration amplifier to integrate the peak-to-peak of the fundamental sinusoid, but integrating less than the peak-to-peak nevertheless produces an operational system. That is, integrating less than the peak-to-peak merely changes the magnitude of the value integrated, but the compensation stored on the feedback capacitor 242 may still be controlled by selecting a higher gain form the integrating amplifier 204.

To the extent the OTA 202 itself has a DC offset, that DC offset manifests itself as slight change in the peak voltage of the square wave, and a slight change in the trough voltage of the square wave. That is, the DC offset of the OTA 202 affects both the peak and the trough voltages equally. However, the presence of the blocking capacitor 232 blocks the DC offset of the OTA 202 from the integration, and thus the companion circuit 114 need not compensate for the DC offset of the OTA 202. Stated otherwise, the DC offset of the OTA 202 does not affect the compensation signal created across the feedback capacitor 242. For this reason, the OTA 202 need not be designed and constructed to match the primary operational amplifier 112. In fact, the performance characteristics of the OTA 202 can be well below the performance characteristics of the primary operational amplifier 112. Thus, the OTA 202 may use significantly less die space in spite of performing a component of the compensation of the primary operational amplifier 112.

Depending on the magnitude of the DC offset of the primary operational amplifier 112, the gain of the OTA 202, the duration of the integration, and the size of the feedback capacitor 242, the companion circuit 114 may take one to ten periods of the square wave, and in some cases about three periods, to cancel or compensate the DC offset of the primary operational amplifier 112. Nevertheless, the DC offset is cancelled during continuous operation of the primary operational amplifier 112.

The example method discussed with respect to FIG. 6 has the integrating amplifier 204 integrating a low-to-high transition of the square wave of plot 600. However, in other cases the integration may occur across a high-to-low transition of the square wave of plot 600, resulting in a voltage across the feedback capacitor 242 having the same amplitude but opposite polarity. By swapping the connection of the leads of the feedback capacitor 242 to the primary operational amplifier 112, the system would work equivalently.

Returning briefly to FIG. 2. In the example embodiments the input switch network 200 has separate control inputs 218 and 220 to implement delay in the transition between the two switch configurations. The delay in the transition may be to ensure that the switch(es) from the first operational state are fully non-conductive before making the switch(es) from the second operational state conductive to avoid shoot through of the DC offset signal (which would then affect the primary operational amplifier 112). Even with the system implementing the delay in the transition, the OTA 202 may experience short periods of transient operation as the voltage applied across its non-inverting input 222 and inverting input 224 change suddenly. The transient operation may result in transient currents produced by the OTA 202, and thus transient voltages at the applied to the integrating amplifier 204. In some example embodiments, any such transient operation of the OTA 202 caused by swapping of the inputs to the OTA 202 may be reduced or avoided by momentarily disconnecting the OTA 202 from the integrating amplifier 204.

Figure 7:
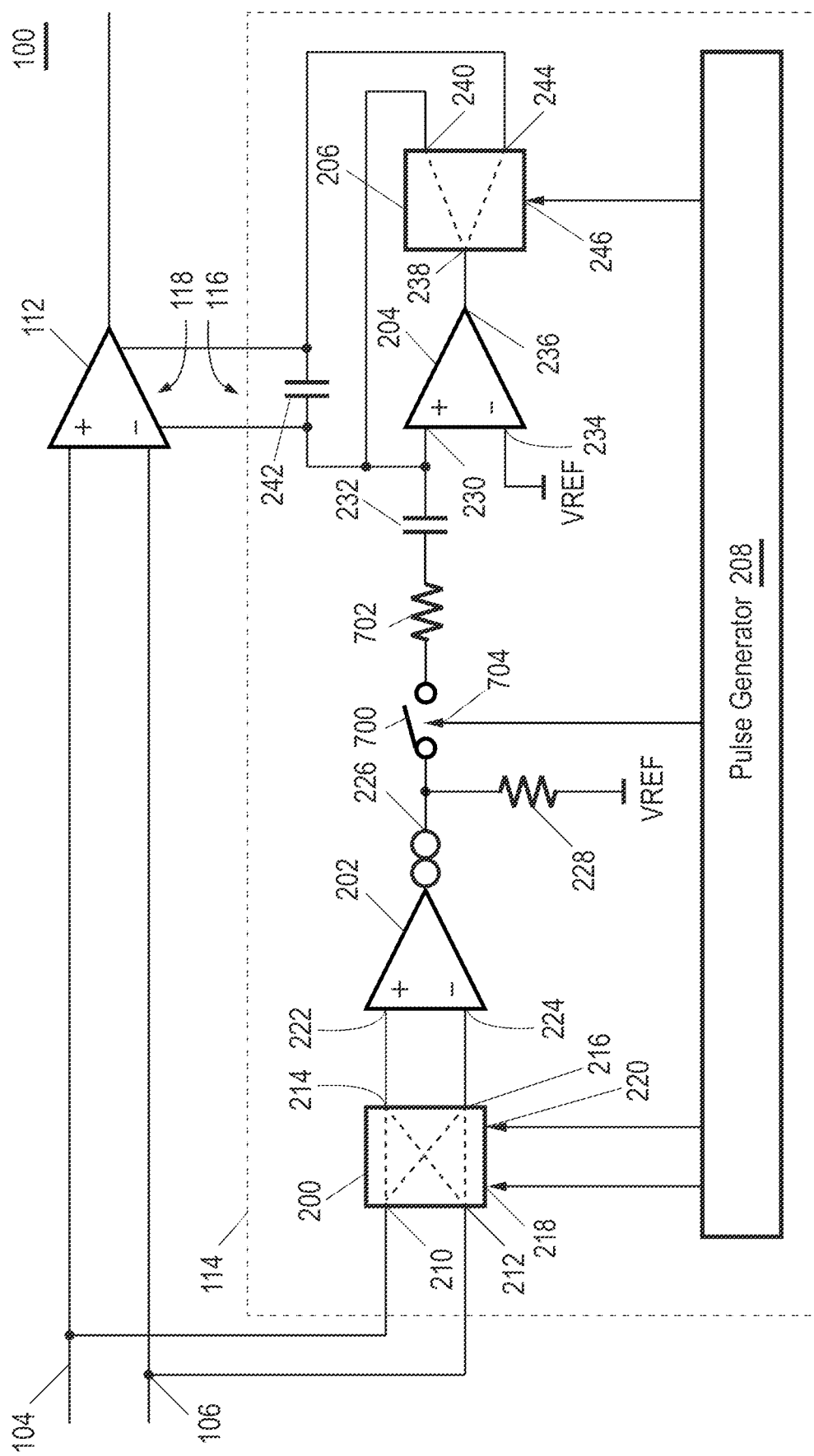
FIG. 7 shows a circuit diagram of an operational amplifier system in accordance with at least some embodiments.

FIG. 7 shows a circuit diagram of another example operational amplifier system. In particular, the example operational amplifier system 100 has all the components of the system of FIG. 2. However, the example operational amplifier system 100 of FIG. 7 further includes an electrically-controlled switch 700 and resistor 702 coupled between the sense output 226 of the OTA 202 and the blocking capacitor 232. As before, the electrically-controlled switch is shown as a single-pole single-throw switch that, in practice, may be implemented as a transistor (e.g., FET). The example switch 700 defines a first lead coupled to the sense output 226 of the OTA 202, a second lead coupled to a first lead of the resistor 702, and a control input 704 coupled to the pulse generator 208. The second lead of the resistor 702 is coupled to the blocking capacitor 232.

Referring simultaneously to FIGS. 6 and 7. The control input 704 is coupled to the pulse generator 208 and receives a clock or timing signal ϕD shown in plot 608. During periods of time when the control input 704 is asserted (e.g., ϕD is asserted), the switch 700 is conductive and thus the OTA 202 is coupled to the integrating amplifier 204. However, during periods of time when the control input 704 is de-asserted (e.g., ϕD is de-asserted), the switch 700 is non-conductive, thus disconnecting the OTA 202 from the integrating amplifier 204. The example timing signal ϕD is de-asserted in each period of the square wave for short period of time during the transition of the square wave. Inasmuch as in the example system the integration is of the low-to-high transition of the square wave, the example timing signal ϕD is de-asserted briefly during each low-to-high transition. Stated otherwise, in the example system timing signal ϕD is de-asserted contemporaneously with the de-assertion of the timing signal ϕB or contemporaneously with the assertion of the timing signal ϕA. De-assertion of the timing signal ϕD makes the switch 700 non-conductive during transition of the square wave to ensure than any artifacts in the square wave caused by the OTA 202 changing its output (e.g., overshoot, temporary oscillation) are not integrated by the integrating amplifier 204.

Figure 8:
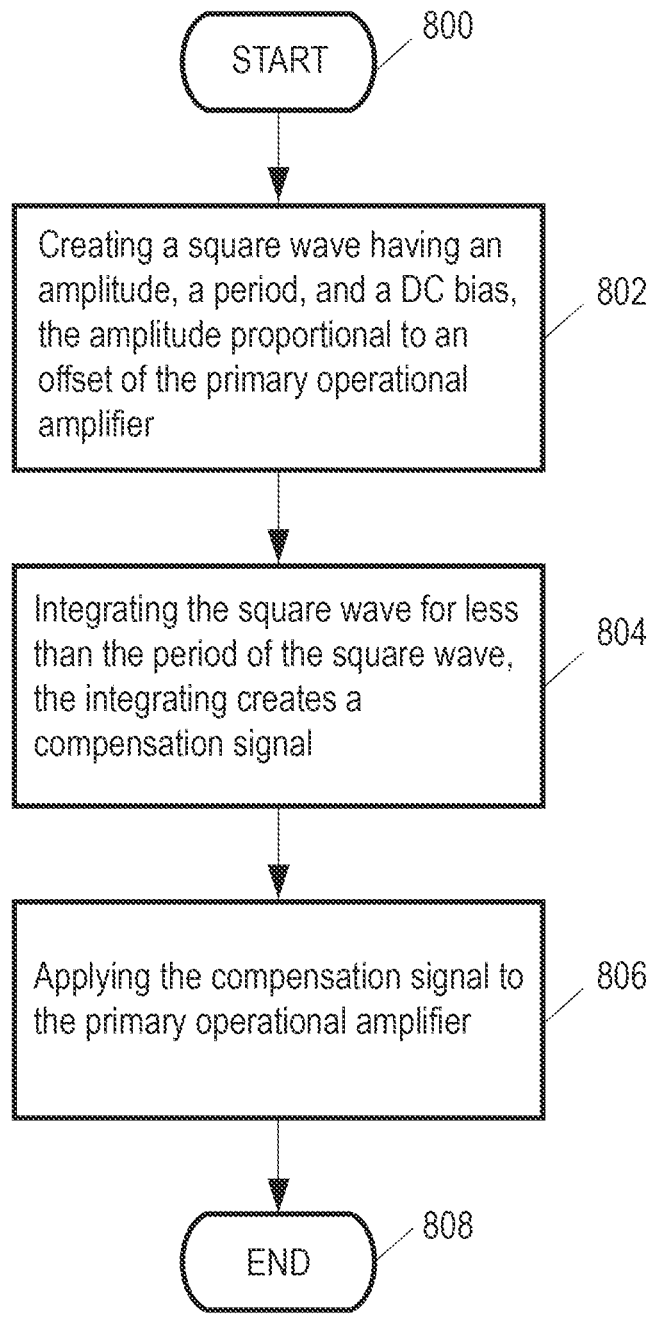
FIG. 8 shows a method in accordance with at least some embodiments.

FIG. 8 shows a method in accordance with at least some embodiments. In particular, the method starts (block 800), and comprises compensating a primary operational amplifier by: creating, by way of a companion circuit, a square wave having an amplitude, a period, and a DC bias, the amplitude proportional to an offset of the primary operational amplifier (block 802); integrating, by the companion circuit, the square wave for less than the period of the square wave, the integrating creates a compensation signal (block 804); and applying the compensation signal to the primary operational amplifier (block 806). Thereafter, the method ends (block 808).

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various embodiments of the present invention. Numerous variations and modifications will become apparent to those skilled in the art once the above disclosure is fully appreciated. For example, the reference voltage VREF used with the OTA 202 and resistor 228 need not be the same as the VREF coupled to the integrating amplifier. It is intended that the following claims be interpreted to embrace all such variations and modifications.

What is claimed is:

1. A method of compensating a primary operational amplifier comprising:
    creating, by way of a companion circuit, a square wave having an amplitude, a period, and a direct current bias (DC bias), the amplitude proportional to an offset of the primary operational amplifier;
    integrating, by the companion circuit, an amplitude of the square wave for less than the period of the square wave, the integrating creates a compensation signal; and
    applying the compensation signal to the primary operational amplifier.

2. The method of claim 1 further comprising:
    applying a feedback signal across a first input and a second input of the primary operational amplifier;
    selectively applying the feedback signal across a first input and a second input of a sense amplifier, the sense amplifier is distinct from the primary operational amplifier; and
    generating, at an output of the sense amplifier, the square wave.

3. The method of claim 2 wherein the selectively applying the feedback signal further comprises:
    applying the feedback signal to the first and second inputs with a first polarity; and then
    applying the feedback signal to the first and second inputs with a second polarity opposite the first polarity.

4. The method of claim 2 wherein the selectively applying the feedback signal further comprises selectively applying the feedback signal across the first and second inputs of the sense amplifier being an operational transconductance amplifier.

5. The method of claim 1 wherein the integrating the amplitude of the square wave further comprises integrating for half the period or less.

6. The method of claim 5 wherein the integrating the amplitude of the square wave further comprises integrating the square wave across a single state transition of the square wave.

7. The method of claim 6 wherein applying the compensation signal further comprises applying a voltage developed across a capacitor to the primary operational amplifier.

8. An operational amplifier system comprising:
    a primary operational amplifier defining a first primary input, a compensation input, and a primary output;
    a sense amplifier defining a first sense input, and a sense output;

a pulse generator defining a pulse output, the pulse generator configured to drive a clock signal to the pulse output, the clock signal having a period that includes a first clock transition and a second clock transition;

an input switch network defining a control input coupled to the pulse output, the input switch network coupled between the first primary input and the first sense input, the input switch network configured to couple the first primary input to the first sense input when the control input is asserted, and configured to de-couple the first primary input from the first sense input when the control input is de-asserted;

an integrating amplifier defining a integration input coupled to the sense output, a integration output, and a feedback capacitor coupled between the integration output and the integration input, a lead of the feedback capacitor coupled to the compensation input; and the integrating amplifier configured to drive a compensation voltage on the feedback capacitor for a time duration that includes the first clock transition.

9. The operational amplifier system of claim 8 further comprising:
the primary operational amplifier further defines a second primary input;
the sense amplifier further defines a second sense input;
the input switch network is further coupled between the second primary input and the second sense input;
the input switch network is further configured to couple the second primary input to the second sense input when the control input is asserted, and configured to cross-couple the first and second primary inputs to the first and second sense inputs when the control input is de-asserted.

10. The operational amplifier system of claim 8 wherein integrating amplifier is configured to generate the compensation voltage for the time duration being half the period or less.

11. The operational amplifier system of claim 8 further comprising:
the pulse generator defining a pre-charge output, the pulse generator configured to drive a pre-charge signal to the pre-charge output, the pre-charge signal having the period and a phase;
a feedback switch network defining a control input coupled to the pre-charge output, the feedback switch network coupled to the integration output, the feedback capacitor, and the integration input;
the feedback switch network configured to couple the integration output to the feedback capacitor when the pre-charge signal is asserted, and to couple the integration output to the integration input when the control input is de-asserted;
wherein the integrating amplifier is configured to generate the compensation voltage when the integration output is coupled the feedback capacitor by the feedback switch network, and the integrating amplifier is configured to pre-charge the integration input with a reference voltage when the integration output is coupled to the integration input.

12. The operational amplifier system of claim 8 further comprising an electrically-controlled switch coupled between the sense amplifier and the integrating amplifier, the electrically-controlled switch configured to de-couple the sense amplifier from the integrating amplifier for a blanking period that includes the first clock transition.

13. An electronic circuit comprising:
a primary operational amplifier defining a first primary input, a compensation input, and a primary output;
a feedback circuit coupled between the primary output and the first primary input;
a companion circuit configured to:
create a square wave having an amplitude, a period, and a direct current bias (DC bias), the amplitude proportional to an offset of the primary operational amplifier;
integrate an amplitude of the square wave for less than the period of the square wave, the integrating creates a compensation signal; and
applying the compensation signal to the primary operational amplifier.

14. The electronic circuit of claim 13 wherein the companion circuit further comprises:
a sense amplifier defining a first sense input, a second sense input, and a sense output;
an input switch network coupled between the first primary input and the first and second sense inputs, the input switch network configured to selectively couple the first primary input to the first sense input or the second sense input; and
the sense amplifier configured to generate, at the sense output, the square wave.

15. The electronic circuit of claim 14 further comprising:
the primary operational amplifier further defines a second primary input;
wherein the input switch network is further configured to:
couple the first and second primary inputs to the first and second sense inputs with a first polarity; and then
couple the first and second primary inputs to the first and second sense inputs with a second polarity opposite the first polarity.

16. The electronic circuit of claim 14 wherein the sense amplifier is an operational transconductance amplifier.

17. The electronic circuit of claim 13 wherein when the companion circuit integrates the amplified of the square wave, the companion circuit is further configured to integrate for half the period or less.

18. The electronic circuit of claim 17 further comprising:
an integrating operational amplifier having a capacitive feedback;
the integrating operational amplifier configured to perform the integration.

19. The electronic circuit of claim 18 wherein when the companion circuit applies the compensation signal, the companion circuit is further configured to apply a voltage developed across the capacitive feedback to the primary operational amplifier.

20. The electronic circuit of claim 17 wherein when the companion circuit integrates the square wave, the companion circuit is further configured to integrate the square wave across a single state transition of the square wave.

* * * * *